(12) United States Patent
Hoentschel et al.

(10) Patent No.: US 8,143,132 B2
(45) Date of Patent: Mar. 27, 2012

(54) TRANSISTOR INCLUDING A HIGH-K METAL GATE ELECTRODE STRUCTURE FORMED ON THE BASIS OF A SIMPLIFIED SPACER REGIME

(75) Inventors: Jan Hoentschel, Dresden (DE); Sven Beyer, Dresden (DE); Thilo Scheiper, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 12/899,333

(22) Filed: Oct. 6, 2010

(65) Prior Publication Data
US 2011/0129972 A1 Jun. 2, 2011

(30) Foreign Application Priority Data

Nov. 30, 2009 (DE) .......................... 10 2009 047 312

(51) Int. Cl.
*H01L 21/336* (2006.01)
(52) U.S. Cl. ................. 438/303; 438/696; 257/E21.619
(58) Field of Classification Search .................. 438/301, 438/302, 303, 306, 696; 257/E21.619, E21.62, 257/E21.623, E21.626, E21.634, E21.637, 257/E21.635
See application file for complete search history.

(56) References Cited

U.S. PATENT DOCUMENTS

| 2007/0001241 A1* | 1/2007 | Lim et al. | 257/410 |
|---|---|---|---|
| 2007/0215950 A1* | 9/2007 | Aoyama | 257/369 |
| 2008/0224238 A1* | 9/2008 | Kanakasabapathy et al. | 257/411 |
| 2008/0277726 A1* | 11/2008 | Doris et al. | 257/351 |
| 2009/0206416 A1* | 8/2009 | Cheng et al. | 257/369 |
| 2009/0230479 A1* | 9/2009 | Hsu et al. | 257/369 |
| 2009/0298245 A1* | 12/2009 | Doris et al. | 438/216 |

FOREIGN PATENT DOCUMENTS
WO    WO 00/79581 A2    12/2000

OTHER PUBLICATIONS

Translation of Official Communication from German Patent Office for German Patent Application No. 10 2009 047 312.2-33 dated Mar. 10, 2011.

* cited by examiner

*Primary Examiner* — William D Coleman
*Assistant Examiner* — Su Kim
(74) *Attorney, Agent, or Firm* — Williams, Morgan & Amerson, P.C.

(57) ABSTRACT

In sophisticated semiconductor devices, the threshold voltage adjustment of high-k metal gate electrode structures may be accomplished by a work function metal species provided in an early manufacturing stage. For this purpose, a protective sidewall spacer structure is provided, which is, in combination with a dielectric cap material, also used as an efficient implantation mask during the implantation of extension and halo regions, thereby increasing the ion blocking capability of the complex gate electrode structure substantially without affecting the sensitive gate materials.

10 Claims, 7 Drawing Sheets

TRANSISTOR INCLUDING A HIGH-K METAL GATE ELECTRODE STRUCTURE FORMED ON THE BASIS OF A SIMPLIFIED SPACER REGIME

BACKGROUND OF THE INVENTION

1. Field of the Invention

Generally, the present disclosure relates to the fabrication of highly sophisticated integrated circuits including transistor elements that comprise a high-k metal gate electrode structure formed in an early process stage.

2. Description of the Related Art

The fabrication of advanced integrated circuits, such as CPUs, storage devices, ASICs (application specific integrated circuits) and the like, requires a great number of circuit elements to be formed on a given chip area according to a specified circuit layout, wherein field effect transistors represent one important type of circuit element that substantially determines performance of the integrated circuits. Currently, a plurality of process technologies are practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a planar transistor architecture, on the distance between the source and drain regions, which is also referred to as channel length.

Presently, the vast majority of integrated circuits are formed on the basis of silicon due to its substantially unlimited availability, the well-understood characteristics of silicon and related materials and processes and the experience gathered during the past 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and thus allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material for gate insulation layers that separate the gate electrode, frequently comprised of polysilicon, from the silicon channel region. In steadily improving device performance of field effect transistors, the length of the channel region has been continuously decreased to improve switching speed and drive current capability. Since the transistor performance is controlled by, among other things, the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling in combination with sophisticated lateral and vertical dopant profiles in the drain and source regions to avoid the so-called short channel behavior during transistor operation. The short channel behavior may lead to an increased leakage current and to a pronounced dependence of the threshold voltage on the channel length. Aggressively scaled planar transistor devices with a relatively low supply voltage and thus reduced threshold voltage may suffer from an exponential increase of the leakage current due to the required enhanced capacitive coupling of the gate electrode to the channel region. Thus, the thickness of the silicon dioxide layer has to be correspondingly reduced to provide the required capacitance between the gate and the channel region. For example, a channel length of approximately 0.08 µm may require a gate dielectric made of silicon dioxide as thin as approximately 1.2 nm. Although usage of high speed transistor elements having an extremely short channel may typically be restricted to high speed applications, whereas transistor elements with a longer channel may be used for less critical applications, such as storage transistor elements, the relatively high leakage current caused by the direct tunneling of charge carriers through an ultra-thin silicon dioxide gate insulation layer may reach values for an oxide thickness in the range of 1-2 nm that may no longer be compatible with requirements for many types of circuits.

For this reason, new strategies have been developed in overcoming the limitations imposed by high leakage currents of extremely thin silicon oxide based gate insulation layers. One very promising approach is the replacement of the conventional dielectric materials, at least partially, by dielectric materials having a dielectric constant that is significantly greater than the dielectric constant of silicon dioxide based materials. For example, dielectric materials, also referred to as high-k dielectric materials, with a dielectric constant of 10.0 and significantly higher may be used, for instance in the form of hafnium oxide, zirconium oxide and the like. In addition to providing a high-k dielectric material in the gate insulation layers, appropriate metal-containing materials may also have to be incorporated since the required work function values for P-channel transistors and N-channel transistors may not be obtained on the basis of standard polysilicon gate materials. To this end, appropriate metal-containing materials may be provided so as to cover the sensitive high-k dielectric materials and act as a source for incorporating an appropriate metal species, such as lanthanum, aluminum and the like, in order to appropriately adjust the work function for N-channel transistors and P-channel transistors, respectively. Furthermore, due to the presence of a metal-containing conductive material, the generation of a depletion zone, as may typically occur in polysiliconbased electrode materials, may be substantially avoided. The process of fabricating a sophisticated gate electrode structure on the basis of a high-k dielectric material may require a moderately complex process sequence due to, for instance, the adjustment of an appropriate work function for the transistors of different conductivity type and the fact that high-k dielectric materials may typically be very sensitive when exposed to certain process conditions, such as high temperatures in the presence of oxygen and the like. Therefore, different approaches have been developed, such as providing the high-k dielectric material at an early manufacturing stage and processing the semiconductor devices with a high degree of compatibility with standard process techniques, wherein the typical electrode material polysilicon may be replaced in a very advanced manufacturing stage with appropriate metals for adjusting the work function of the different transistors and for providing a highly conductive electrode metal. While this approach may provide superior uniformity of the work function and thus of the threshold voltage of the transistors, since the actual adjustment of the work function may be accomplished after any high temperature processes, a complex process sequence for providing the different work function metals in combination with the electrode metal may be required. In other very promising approaches, the sophisticated gate electrode structures may be formed in an early manufacturing stage, while the further processing may be based on the plurality of well-established process strategies. In this case, the high-k dielectric material and any metal species for adjusting the work function may be provided prior to or upon patterning the gate electrode stack, which may comprise well-established materials, such as silicon or silicon/germanium, thereby enabling the further processing on the basis of well-established process techniques. On the other hand, the gate electrode stack and, in particular, the sensitive high-k dielectric materials, in combination with any metal-containing cap layers, may remain reliably confined by appropriate materials throughout the entire processing of the semiconductor device.

Although the approach of providing a sophisticated high-k metal gate electrode structure with an appropriately set work function in an early manufacturing stage may be a very promising approach, it turns out that conventional strategies may suffer from a plurality of process non-uniformities, as will be explained in more detail with reference to FIGS. 1*a*-1*b*.

FIG. 1*a* schematically illustrates a cross-sectional view of a semiconductor device 100, comprising a substrate 101, such as a silicon substrate, and a silicon-based semiconductor layer 102, which may represent a portion of a crystalline silicon material of the substrate 101, when a "bulk" configuration is provided. In the manufacturing stage shown, the semiconductor device 100 further comprises transistors 150A, 150B in an early manufacturing stage, wherein the transistors 150A, 150B are formed in and above respective active regions 102A and 102B. An active region is to be understood as a semiconductor region in the layer 102 in which the PN junctions for one or more transistors are to be formed. In the example shown, the transistor 150A represents a P-channel transistor, while the transistor 150B represents an N-channel transistor. The transistors 150A, 150B comprise gate electrode structures 160A, 160B, respectively. In this manufacturing stage, the gate electrode structures 160A, 160B comprise a gate dielectric material 161, which may be referred to as a high-k dielectric gate insulation layer, since at least a portion of the gate dielectric material 161 may comprise a material or layer providing a dielectric constant of approximately 10.0 or higher. For example, hafnium oxide based materials, zirconium oxide based materials and the like may frequently be used as a high-k dielectric material portion in sophisticated gate electrode structures, possibly in combination with "conventional" gate dielectrics, such as silicon oxynitride and the like. Furthermore, the gate electrode structures 160A, 160B comprise an electrode material 163, for instance in the form of a silicon material, such as amorphous or polycrystalline silicon material. Furthermore, a dielectric cap layer 164, typically comprised of silicon nitride, possibly in combination with silicon dioxide, is formed on top of the electrode material 163. The gate electrode structure 160A further comprises a conductive cap material 162A formed on the gate dielectric material 161 and comprising an appropriate work function adjusting metal species, such as aluminum, thereby obtaining the desired electronic characteristics. It should be appreciated that, in some approaches, the active region 102A may comprise an appropriate "channel" semiconductor material 102C in order to obtain a desired band gap offset, which, in combination with materials 161 and 162A, results in the desired threshold voltage of the transistor 150A. For example, the material 102C is provided as a silicon/germanium mixture or alloy with a specified thickness and germanium concentration as required for adapting the band gap offset for the transistor 150A. Similarly, the gate electrode structure 160B comprises a conductive cap layer 162B, which in turn contains an appropriate work function adjusting metal species, such as lanthanum and the like.

Additionally, since the stability of the work function and thus threshold voltage of the transistors 150A, 150B strongly depends on the integrity of the materials 161 and 162A, 162B, a spacer or liner material 165 is provided so as to confine the sidewalls of the gate electrode structures 160A, 160B. For this purpose, typically, silicon nitride material is used, which may be formed on the basis of sophisticated deposition techniques, such as thermally activated chemical vapor deposition (CVD), plasma assisted CVD techniques or any combination thereof, in which a highly conformal and dense silicon nitride material is obtained. Furthermore, in this manufacturing stage, a sacrificial spacer 103, such as an oxide spacer and the like, is formed on the protective spacer 165.

Typically, the semiconductor device 100 as illustrated in FIG. 1*a* may be formed on the basis of the following processes. After providing the active regions 102A, 102B, which is typically accomplished by forming isolation structures (not shown) so as to laterally delineate respective semiconductor regions in the layer 102, followed by the incorporation of an appropriate dopant species in order to adjust the basic transistor characteristics, materials for the gate dielectric material 161 and the conductive cap layers 162A, 162B are formed. For this purpose, well-established manufacturing techniques may be used. For example, the gate dielectric material 161 may be provided in the form of a silicon oxynitride material, followed by a high-k dielectric material, such as hafnium oxide. Thereafter, one or more materials are deposited, such as titanium nitride, in combination with an appropriate work function species, such as aluminum. Depending on the process strategy, appropriate materials may also be deposited for the gate electrode structure 160B, while an unwanted portion of any previously-provided materials may be removed on the basis of well-established lithography and patterning strategies. Furthermore, a thermal stabilization of these materials may be accomplished in this manufacturing stage, if required, so as to diffuse the metal species into the gate dielectric material 161. If required, the metal materials may be removed and an electrode material, such as titanium nitride and the like, may be commonly applied for the gate electrode structures 160A, 160B. Next, the silicon material 163 is deposited, for instance, by low pressure CVD and the like, followed by the deposition of the dielectric cap material 164. Furthermore, additional materials, such as hard mask materials, anti-reflective coating (ARC) materials and the like, may be provided as required. Thereafter, a complex lithography and etch sequence is performed, thereby patterning the gate electrode structures 160A, 160B so as to obtain the desired gate length in accordance with the design rules. For example, the gate length, i.e., in FIG. 1a, the horizontal extension of, for example, the conductive cap materials 162A, 162B, may be 40 nm and less.

Thereafter, the protective sidewall spacer structure 165 is formed, for instance, by depositing a silicon nitride material and etching the same on the basis of a plasma assisted etch process. Consequently, during any subsequent processes, such as cleaning processes and the like, the materials 161 and 162A, 162B are confined by the spacer 165. In order to avoid undue variations of the electronic characteristics of the gate electrode structures 160A, 160B, at least the materials 161 and 162A, 162B have to be confined by the spacer 165 throughout the entire process flow, since, typically, many wet chemical etch processes on the basis of sulfuric acid, hydrofluoric acid and the like have to be performed, which may, upon contacting, for instance, the material 162A, 162B, remove a significant portion, thereby causing corresponding device failures.

Furthermore, in any advanced manufacturing stage, the sacrificial spacers 103 may be formed by depositing, for instance, a silicon dioxide material and etching this material on the basis of a plasma assisted etch recipe. The sacrificial spacers 103 are provided so as to protect the spacers 165 during an etch process for removing the dielectric cap material 164, which has been used during the patterning of the gate electrode structures 160A, 160B and which may also be used in other process sequences, in which a reliable confinement of the materials 163, 162A, 162B and 161 of the gate electrode structures 160A, 160B is required.

Due to the previous processing and in particular due to the spacer etch processes for forming the sacrificial spacer 103, a certain degree of recessing, as indicated by 102R, may occur in the active regions 102A, 102B. Moreover, the degree of recessing 102R may be even further increased by removing the dielectric cap layer 164 on the basis of hot phosphoric acid, while the sacrificial spacers 103 may reliably protect the spacers 165. Next, the sacrificial spacers 103 are removed, for instance, on the basis of hydrofluoric acid, substantially without affecting the spacers 165.

FIG. 1b schematically illustrates the semiconductor device 100 in a further advanced manufacturing stage. As illustrated, an offset spacer 166 is formed on the protective spacer element 165 in order to appropriately adjust a lateral offset of implantation species to be incorporated into the active regions 102A, 102B. For this purpose, the gate electrode structures 160A, 160B, in which the dielectric cap layer 164 has been removed, may act as an implantation mask. For instance, an implantation mask may cover the gate electrode structure 160B and the active region 102B, for instance by providing a resist mask (not shown), while the transistor 150A is exposed to an ion implantation process sequence 104A in order to introduce drain and source dopant species for forming drain and source extension regions and also for incorporating a counter doping species, which is typically required for forming halo regions, thereby appropriately adjusting the critical dopant profile, for instance in view of adjusting the off current of the transistors. Typically, the counter doping species is to be positioned below the drain and source extension regions and thus requires a higher implantation energy compared to the drain and source extension regions, wherein, however, the ion blocking effect of the gate electrode structures 160A, 160B may be restricted by height and the length of the electrode material 163. In order to avoid undue penetration of critical areas, such as the materials 162A, 162B by the halo dopant species, the corresponding implantation energy has to be restricted accordingly in order to avoid undue threshold voltage shifts. Furthermore, the significant degree of recessing 102R may also contribute to a less efficient overall dopant profile in the vicinity of the channel regions 153 and may result in a significant reduction of performance of the transistors 150A, 150B, which may particularly affect semiconductor devices designed for low power applications.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques in which a superior degree of confinement of sensitive materials in high-k metal gate electrode structures may be accomplished by providing a corresponding protective spacer element with an appropriate width so as to also act as an offset spacer during implantation processes. Moreover, the critical halo implantation processes may be performed in the presence of the dielectric cap material, which may, therefore, increase the ion blocking effect of the gate electrode structure, wherein the critical etch process for removing the dielectric cap layer may be performed after a plurality of implantation processes and the associated cleaning and resist strip processes, which are typically involved for providing the corresponding implantation masks for transistors of different conductivity type and for transistors of the same conductivity type with different threshold voltage adjustments. Consequently, the number of spacer etch processes may be reduced, thereby providing a superior device topography in the active regions and also increased implantation energies may be applied for the halo implantation processes, which may thus result in a superior dopant profile. Consequently, superior transistor characteristics may be obtained, in particular for transistors for low power applications, in which sophisticated strain-inducing semiconductor materials may not have to be incorporated into the active regions, which may thus provide a superior degree of flexibility in selecting the initial width of the protective spacer element.

One illustrative method disclosed herein comprises forming a gate electrode structure of a transistor above a semiconductor region of a semiconductor device, wherein the gate electrode structure comprises a gate insulation layer comprising a high-k dielectric material, a metal-containing cap material formed on the gate insulation layer, an electrode material formed above the cap material and a dielectric cap layer. The method further comprises forming a protective sidewall spacer structure on sidewalls of the gate electrode structure. The method additionally comprises performing an implantation process so as to introduce a dopant species for forming halo regions in the semiconductor region by using the dielectric cap layer and the protective sidewall spacer structure as an implantation mask. The method further comprises removing the dielectric cap layer while preserving at least a portion of the protective sidewall spacer structure and forming drain and source regions in the semiconductor region.

A further illustrative method relates to forming a transistor of a semiconductor device. The method comprises forming a gate dielectric material on a semiconductor region and forming a conductive cap material on the gate dielectric material, wherein the conductive cap material comprises a work function adjusting metal species. The method additionally comprises forming an electrode material and a dielectric cap layer above the conductive cap material. The method further comprises forming a gate electrode structure from the gate dielectric material, the conductive cap material, the electrode material and the dielectric cap layer. Furthermore, a protective sidewall spacer structure is formed on the sidewalls of the gate electrode structure. The method further comprises forming drain and source extension regions and halo regions in the presence of the dielectric cap layer by using the protective sidewall spacer as an implantation mask for adjusting a lateral offset. The method further comprises removing the dielectric cap layer and forming drain and source regions in the semiconductor region.

A still further illustrative method disclosed herein relates to forming a semiconductor device. The method comprises forming a first gate electrode structure above a first active region, wherein the first gate electrode structure comprises a first work function adjusting metal species. The method additionally comprises forming a second gate electrode structure above a second active region, wherein the second gate electrode structure comprises a second work function adjusting metal species that differs from the first work function adjusting metal species. Moreover, a protective spacer structure is formed on the sidewalls of the first and second gate electrode structures. The method further comprises performing a first implantation sequence to form first drain and source extension regions and halo regions in the first active region by using the protective spacer structure as an implantation mask while masking the second active region. The method further comprises performing a second implantation sequence to form second drain and source extension regions and halo regions in the second active region by using the protective spacer structure as an implantation mask while masking the first active region. Additionally, a second spacer structure is formed on the protective spacer structure and drain and source regions are formed in the first and second active regions by using the second spacer structure as an implantation mask.

BRIEF DESCRIPTION OF THE DRAWINGS

The disclosure may be understood by reference to the following description taken in conjunction with the accompanying drawings, in which like reference numerals identify like elements, and in which.

Figure 1A:
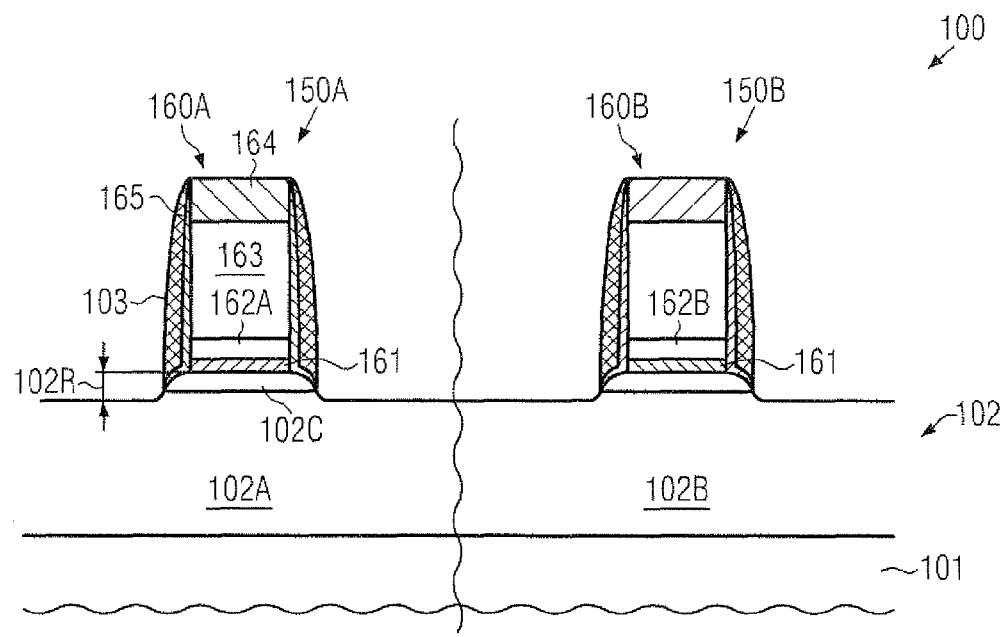
FIGS. 1a-1b schematically illustrate cross-sectional views of a semiconductor device during various manufacturing stages when encapsulating a sophisticated high-k metal gate electrode structure and performing drain and source extension and halo implantation processes, in accordance with conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides manufacturing techniques in which the dielectric cap material of high-k metal gate electrode structures is preserved, at least for the halo implantation processes, thereby enabling appropriate implantation energies to be applied for the halo regions. Moreover, in some illustrative embodiments disclosed herein, the protective sidewall spacer structure may be appropriately configured, with respect to spacer width, so as to act as an efficient offset spacer element for defining the lateral offset of the entry point of the implantation species without being restricted to a very low spacer width, since the incorporation of a strain-inducing semiconductor material in drain and source regions of P-channel transistors, as is frequently applied in high performance semiconductor devices, can be avoided, thereby contributing to a significantly reduced power consumption of the resulting transistor elements, which may be advantageous for forming low power semiconductor devices. On the other hand, the superior surface topography of the active region obtained by avoiding additional spacer etch processes in combination with superior implant energies may contribute to a superior transistor performance, thereby at least partially compensating for the lack of a strain-inducing semiconductor alloy in the P-channel transistors. Furthermore, upon providing an increased width of the protective spacer structure and performing a plurality of cleaning processes and resist strip processes in the presence of the spacer structure, which has not yet been exposed to the reactive etch ambient to remove the dielectric cap material, superior integrity of the sensitive gate materials may be achieved, which in turn directly results in superior threshold voltage stability. Moreover, in some illustrative embodiments disclosed herein, the dielectric cap material may be removed on the basis of a sacrificial material, which may also reliably cover the active region, thereby even further contributing to superior integrity of the sensitive gate materials at the foot of the gate electrode structures. In some illustrative embodiments, the sacrificial material may be removed on the basis of etch techniques, which may not substantially affect the active regions, so that additional topography-related non-uniformities may be avoided.

Figure 1B:
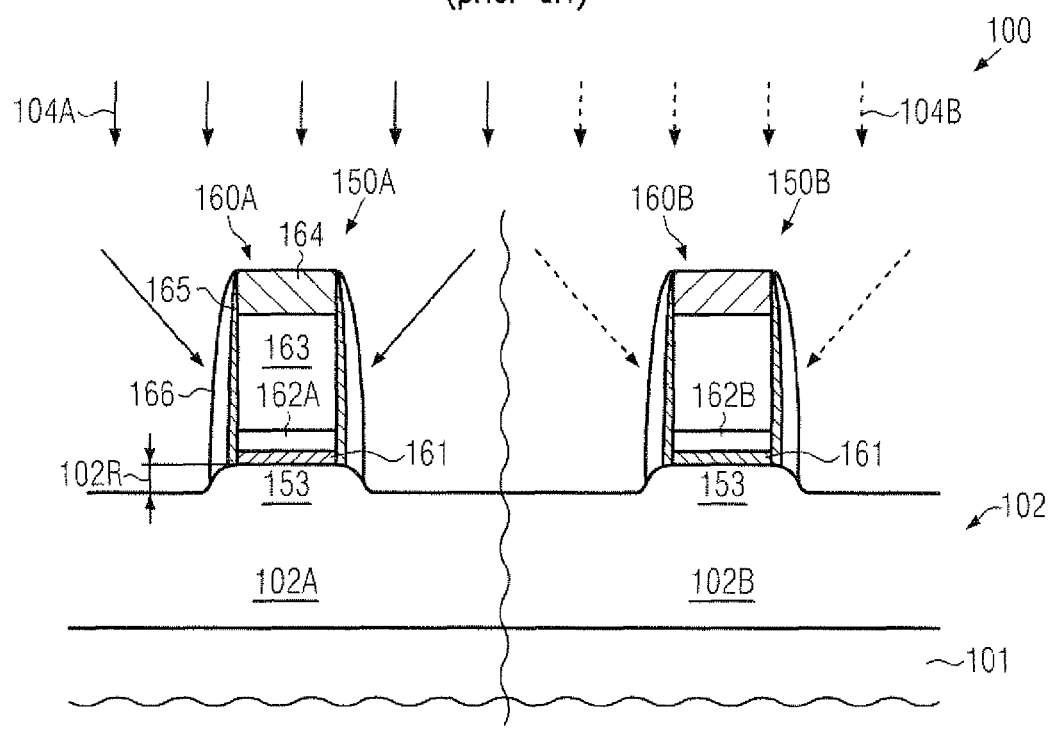

With reference to FIGS. 2a-2l, further illustrative embodiments will now be described in more detail, wherein reference may also be made to FIGS. 1a-1b, if appropriate.

Figure 2A:
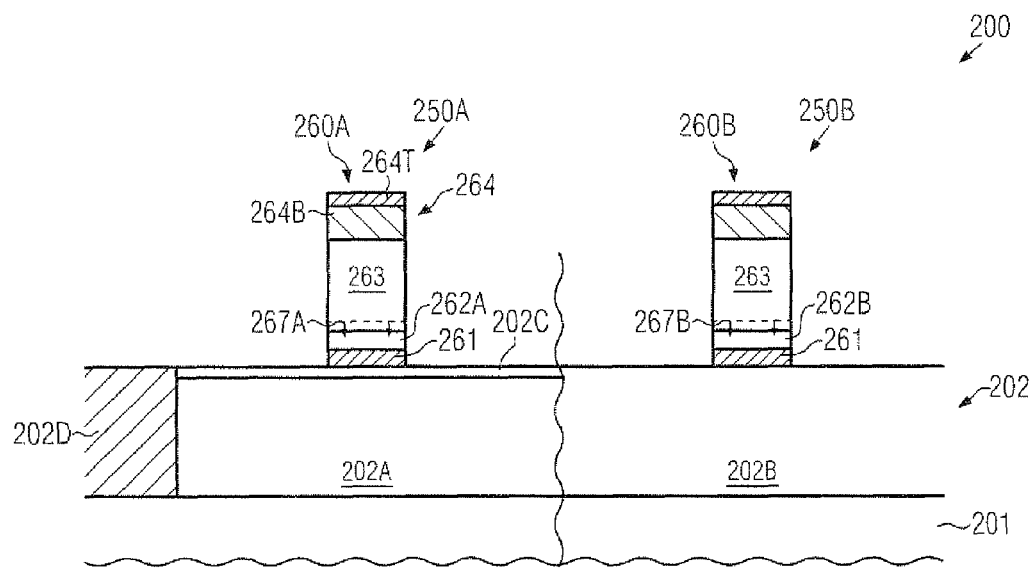
FIGS. 2a-2h schematically illustrate cross-sectional views of a semiconductor device during various manufacturing stages in providing a high-k metal gate electrode structure in an early manufacturing phase and using the gate electrode structure as an implantation mask with increased ion blocking effect due to the presence of a dielectric cap material, according to illustrative embodiments.

FIG. 2a schematically illustrates a cross-sectional view of a semiconductor device 200 in a manufacturing stage in which gate electrode structures 260A, 260B may be formed on active regions 202A, 202B, respectively. The active regions 202A, 202B, which may be understood as semiconductor regions in the above-defined sense, may be formed in a silicon-based semiconductor layer 202 and may be laterally delineated by isolation structures 202D, for instance in the form of shallow trench isolations and the like. The semiconductor layer 202, in combination with a substrate 201, which may represent any appropriate carrier material, may form a bulk configuration, in which the semiconductor layer 202 may extend into the depth direction, i.e., in FIG. 2a, in the downward direction, to any desired thickness, which may be greater than a depth of the active regions 202A, 202B. In other cases, a buried insulating material (not shown) may be provided between the semiconductor layer 202 and the substrate 201, thereby providing a silicon-on-insulator (SOI) configuration. In the embodiment shown, the active region 202A may correspond to the active region of a P-channel transistor, while the active region 202B may be used to form therein and thereabove an N-channel transistor. Furthermore, if required, one of the active regions 202A, 202B, such as the active region 202A, may comprise an additional threshold adjusting semiconductor material 202C, for instance in the form of a silicon/germanium alloy and the like.

In the manufacturing stage shown, the gate electrode structure 260A may comprise a gate dielectric material 261, which may comprise a high-k dielectric material, as previously explained with reference to the device 100, and which may thus comprise two or more individual material layers, if required. Furthermore, a conductive cap material 262A may be formed on the gate dielectric material 261 and may have incorporated therein a work function adjusting metal species 267A, for instance in the form of aluminum and the like. As explained above, the work function adjusting metal species 267A may additionally or alternatively be incorporated in the gate dielectric material 261. Furthermore, an electrode material 263, such as silicon, may be provided, followed by a dielectric cap layer 264, which may comprise a bottom layer 264B, for instance in the form of silicon nitride, in combination with a top layer 264T, for instance in the form of silicon dioxide. The gate electrode structure 260B may have a similar configuration with respect to the components 261, 263 and 264, while a conductive cap layer 262B may comprise a work function adjusting metal species 267B, such as lanthanum and the like. Also in this case, the work function adjusting metal species may additionally or alternatively be incorporated in the gate dielectric material 261.

The semiconductor device 200 as illustrated in FIG. 2a may be formed on the basis of any appropriate process strategies, as is for instance, also described above with reference to the semiconductor device 100. That is, the active regions 202A, 202B and the isolation structure 202D may be formed in accordance with well-established process techniques. If required, the semiconductor material 202C may be formed selectively on the active region 202A so as to become a part thereof, which may be accomplished by means of selective epitaxial growth techniques. Thereafter, appropriate materials for the dielectric gate material 261 may be formed, for instance by deposition, followed by an appropriate deposition and patterning regime for providing conductive cap materials 262A, 262B in combination with the corresponding metal species 267A, 267B. For example, the metal species 267A, 267B may be provided in the form of corresponding metal layers, as indicated by the dashed lines, wherein a subsequent thermal treatment may be performed to diffuse the metal species into the underlying material, thereby forming the conductive cap layers 262A, 262B, respectively. It should be appreciated that any other process strategy for incorporating the appropriate metal species in the materials 262A, 262B may be applied. For example, a diffusion of the metal species into the dielectric material 261 may be initiated by performing a heat treatment, after which the initial layers 262A, 262B, possibly with additional layers, may be replaced with a metal-containing electrode material, such as titanium nitride and the like. For convenience, the corresponding material layers, which may thus have the same configuration in the gate electrode structures 260A, 260B may also be denoted as layers 262A, 262B. After providing the metal species 267A, 267B, the semiconductor material 263 may be deposited, followed by dielectric cap materials 264, possibly in combination with additional materials that are required for patterning the resulting gate layer stack on the basis of sophisticated etch techniques.

Figure 2B:
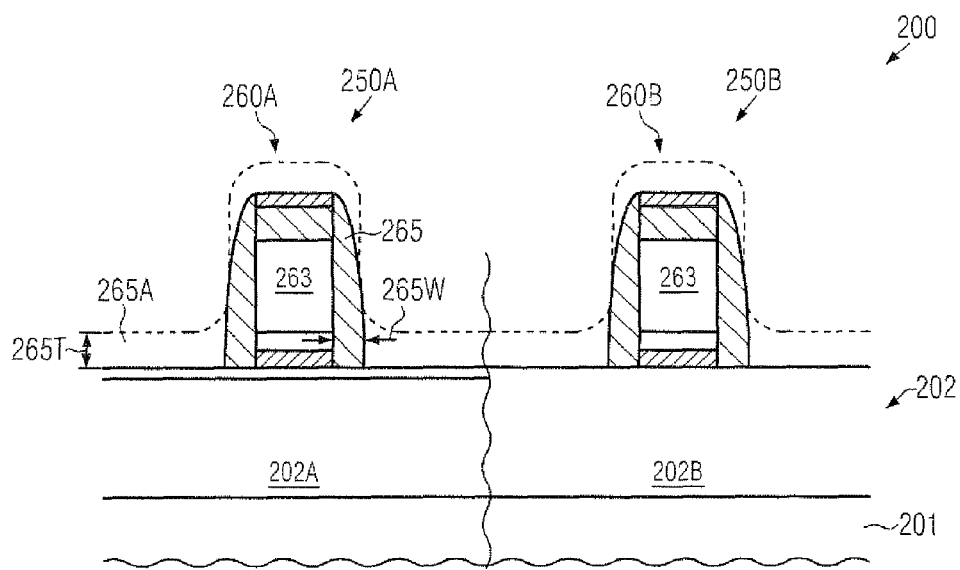

FIG. 2b schematically illustrates the semiconductor device 200 with a protective sidewall spacer structure 265 formed on sidewalls of the gate electrode structures 260A, 260B. The spacer structure 265 may be comprised of silicon nitride material having a desired high density, which may be accomplished by depositing a spacer layer 265A on the basis of established deposition techniques, thereby resulting in a highly conformal layer with well-controlled thickness 265T. For example, the thickness 265T may be adjusted to be approximately 10-30 nm, depending on the device requirements and the further process strategy. After the deposition of the layer 265A, a plasma assisted etch process may be performed to obtain the spacers 265 with a desired width 265W, which is thus substantially determined by the initial thickness 265T and the lateral etch rate of the corresponding plasma assisted etch process. It should be appreciated that, if desired, an additional etch stop material may be formed prior to the deposition of the layer 265A, for instance by oxidizing exposed surface areas of the gate electrode structure 260A and of the active regions 202A, 202B. Thereafter, the further processing may be continued without incorporating a strain-inducing semiconductor material in the active region 202A. Thus, the width 265W may be selected in view of superior confinement of the sensitive materials 261, 262A, 262B (FIG. 2a) and may also be selected with respect to determine the lateral offset of an entry point for dopant species to be incorporated in a later manufacturing stage.

Figure 2C:
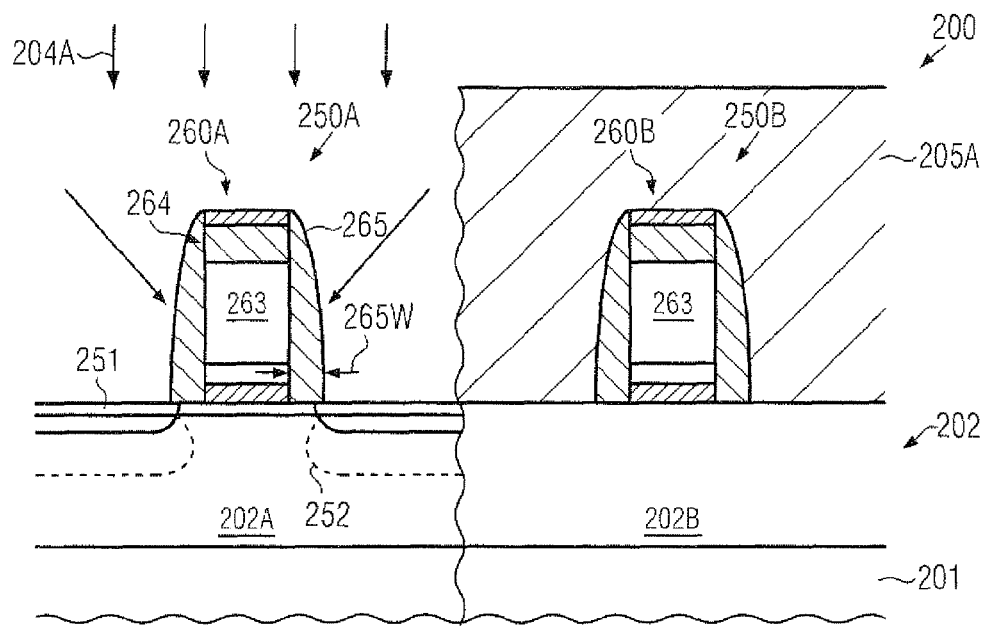

FIG. 2c schematically illustrates the semiconductor device 200 in a further advanced manufacturing stage. As illustrated, an implantation mask 205A, such as a resist mask, may cover the active region 202B and the gate electrode structure 260B, which are part of an N-channel transistor 250B. On the other hand, a transistor 250A, i.e., the gate electrode structure 260A and the active region 202A, may be exposed to a sequence of implantation processes 204A in order to provide drain and source extension regions 251 and counter doped halo regions 252. For this purpose, the implantation sequence 204A may comprise any required number and type of implantation steps, such as incorporating a pre-amorphizing implantation species (not shown) and introducing the drain and source dopant for the extension regions 251. Furthermore, as previously explained, the dopant for the halo regions 252 may have to be positioned adjacent and below the extension regions 251, thereby requiring higher implantation energies, which may be applied without significantly affecting the electronic characteristics of the gate electrode structure 260A due to the presence of the dielectric cap layer 264, while the increased width 265W of the spacer 265 may also provide superior ion blocking capabilities in view of any tilted implantation steps. Moreover, the horizontal point of entry for the various implantation steps of the sequence 204A may also be appropriately determined by the spacer 265 having the width 265W.

Figure 2D:
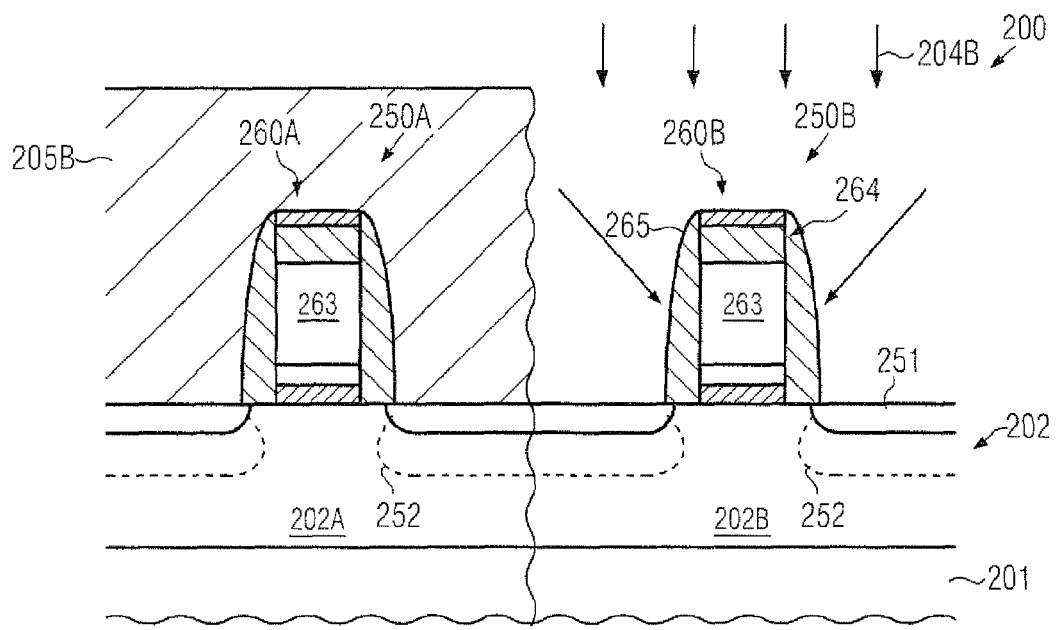

FIG. 2d schematically illustrates the device 200 during a further implantation sequence 204B, in which the transistor 250A may be covered by an implantation mask 205B, while the gate electrode structure 260B, and in particular the dielectric cap layer 264 and the protective spacer structure 265, may act as an implantation mask for the transistor 250B. Consequently, also in this case, appropriate implantation energies may be applied, substantially without unduly affecting the electronic characteristics of the gate electrode structure 260B.

It should be appreciated that the semiconductor device 200 may comprise a plurality of P-channel transistors, which may have a very similar configuration compared to the transistor 250A, which, however, may require different transistor characteristics, which may be accomplished by appropriately controlling implantation energy and dose of the drain and source extension regions 251 and/or the halo regions 252. For this purpose, appropriate masks may be provided during the sequences 204A, 204B as described with reference to FIGS. 2c and 2d in order to avoid undue incorporation of dopant species in such transistors. Thereafter, a dedicated implantation process sequence may be performed for any such transistors. Similarly, N-channel transistors similar to the transistor 250B may require a different dopant profile and concentration, which may also be accomplished by applying a corresponding masking regime. For instance, different "flavors" of basically the same transistor configuration may be obtained, for instance in the form of high threshold voltage transistors, regular threshold voltage transistors, low threshold voltage transistors, which may be accomplished by appropriately performing implantation processes in combination with providing implantation masks. Typically, cleaning processes in addition to the mask removal processes are associated with the various implantation sequences and these aggressive cleaning processes may be performed on the basis of the spacer 265 having the increased width 265W and having not yet suffered any material erosion during a process for etching silicon nitride material, as is typically the case in conventional strategies, as previously explained with reference to the device 100.

Figure 2E:
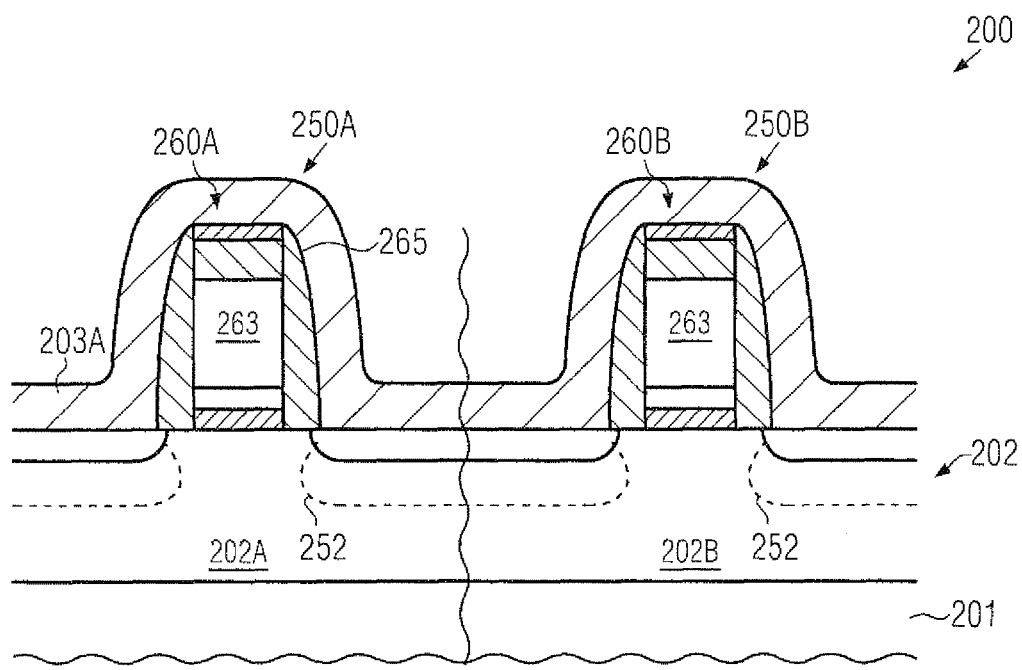

FIG. 2e schematically illustrates the device 200 with a sacrificial spacer layer 203A, for instance in the form of a silicon dioxide material, formed above the active regions 202A, 202B and the gate electrode structures 260A, 260B. For this purpose, any appropriate deposition technique may be used.

Figure 2F:
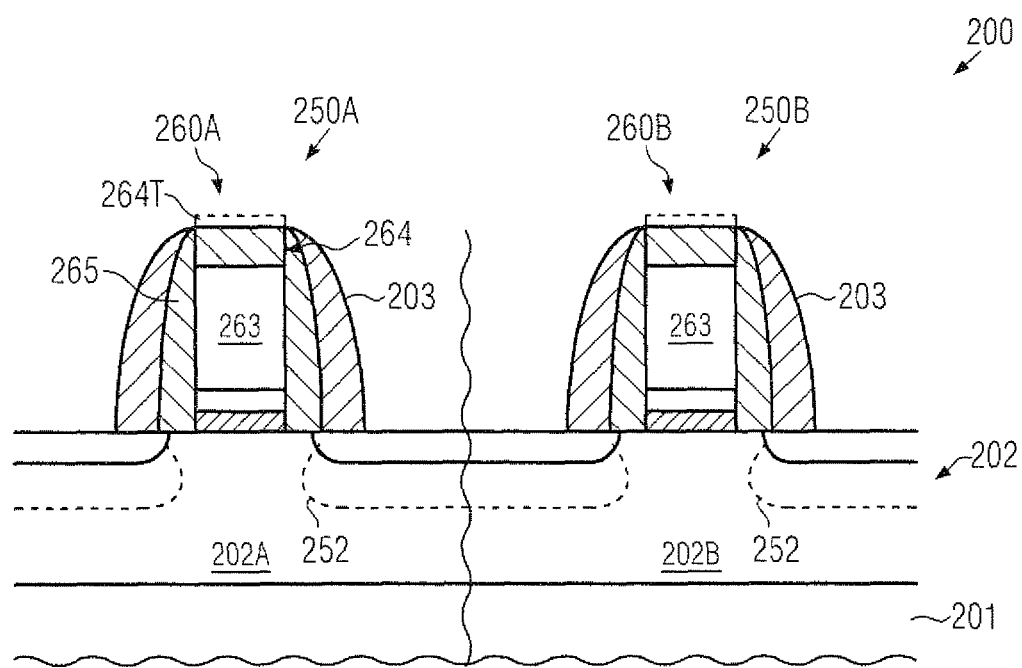

FIG. 2f schematically illustrates the device 200 with sacrificial spacer elements 203 formed on the protective sidewall spacer structure 265, which may be accomplished on the basis of any appropriate plasma assisted etch recipe for etching, for instance, silicon dioxide selectively with respect to silicon and silicon nitride. Furthermore, during the corresponding etch process, a portion of the dielectric cap layer 264, such as the top layer 264T when comprised of silicon dioxide, may also be efficiently removed. It should be appreciated that, due to the simplified overall process flow, in which additional offset spacer elements may not be required, the resulting surface topography of the active regions 202A, 202B may be less pronounced compared to the conventional process strategy, as previously explained.

Figure 2G:
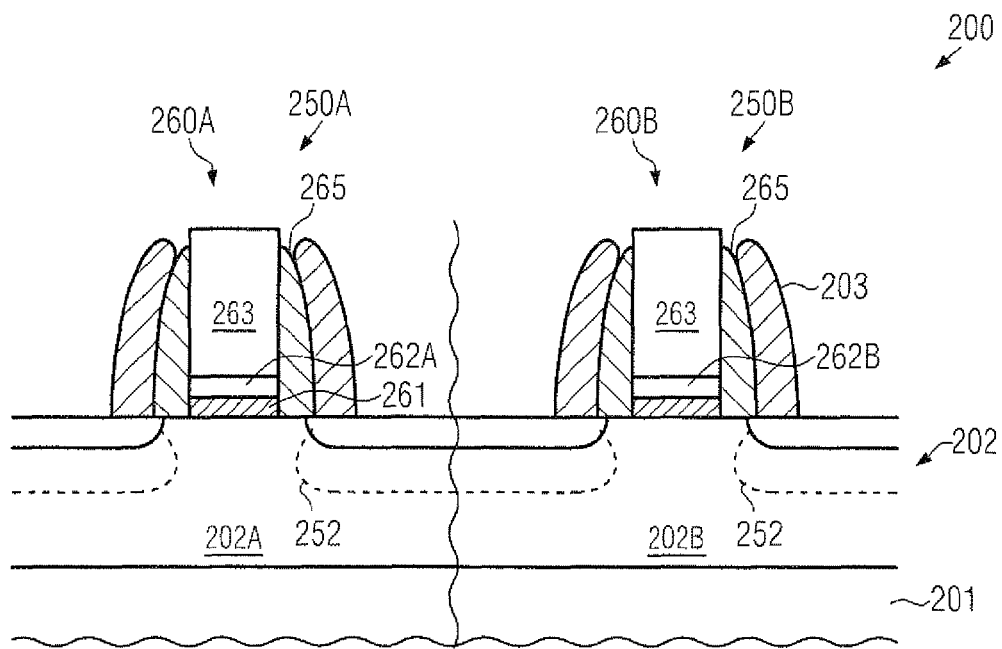

FIG. 2g schematically illustrates the semiconductor device 200 after removing the dielectric cap layer 264 or the remaining portion thereof (FIG. 2f), which may be accomplished on the basis of hot phosphoric acid, wherein the sacrificial spacer 203 may preserve the integrity of at least a significant portion of the spacer structure 265, thereby still reliably confining the sensitive materials 262A, 262B and 261. In other illustrative embodiments, a plasma assisted etch process may be performed to remove the dielectric cap material.

Figure 2H:
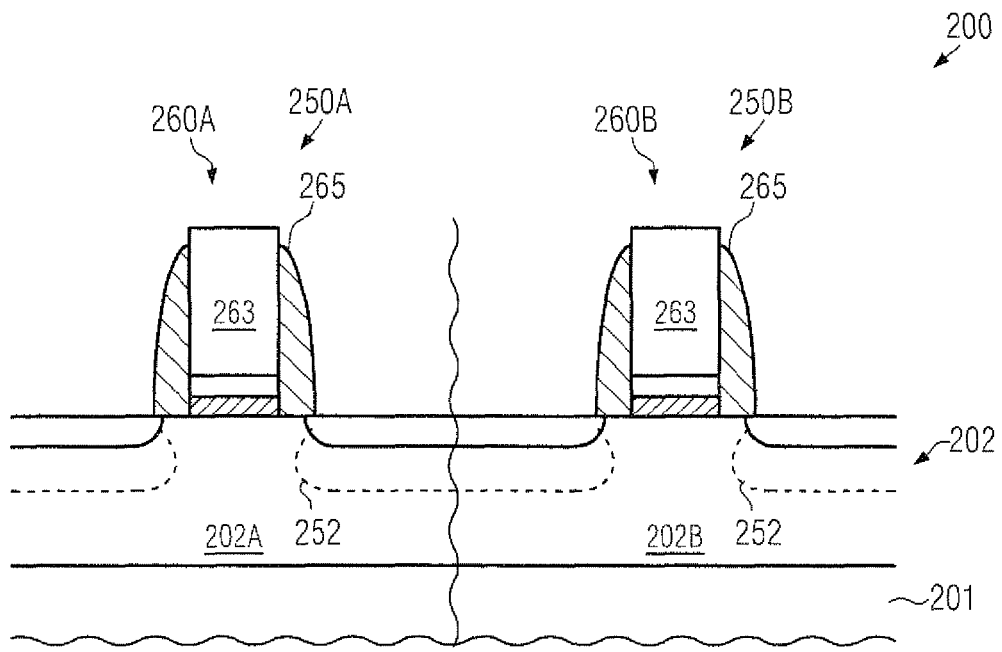

FIG. 2h schematically illustrates the device 200 in a further advanced manufacturing stage, when the sacrificial spacer elements 203 of FIG. 2g have been removed, which may be accomplished by using hydrofluoric acid and the like. Consequently, the transistors 250A, 250B may be in an appropriate stage in order to receive drain and source regions. Furthermore, although the preceding process sequence may have caused a certain loss of material in the active regions 202A, 202B (not shown), the resulting surface topography may be significantly less pronounced compared to a conventional strategy.

Figure 2I:
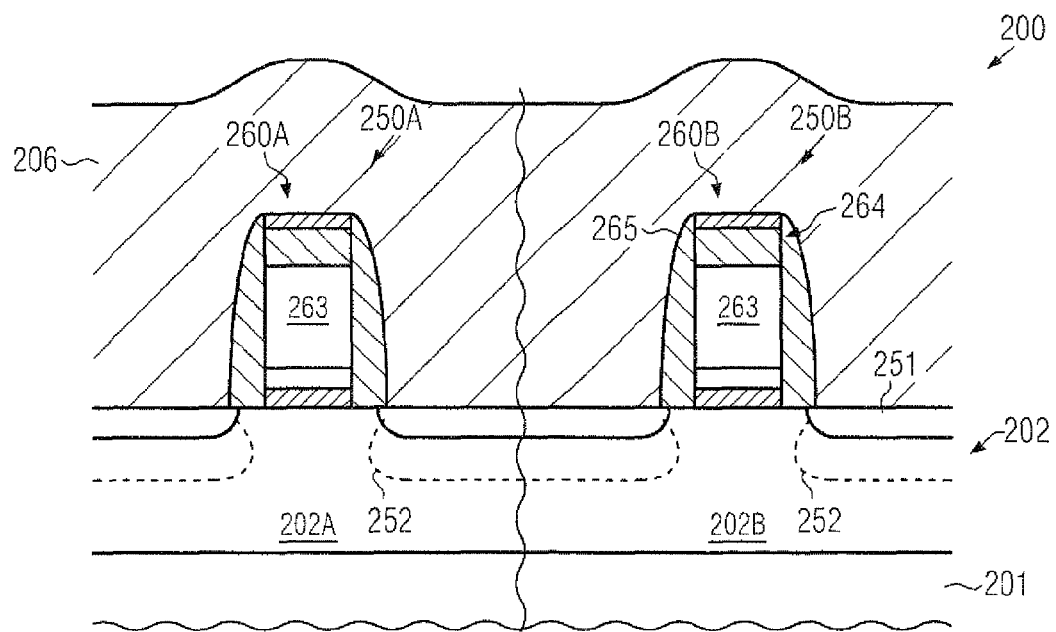
FIGS. 2i-2j schematically illustrate the semiconductor device according to still further illustrative embodiments in which the dielectric cap material is removed on the basis of a sacrificial material that protects the spacer structure and the active regions.

FIG. 2i schematically illustrates the semiconductor device 200 according to illustrative embodiments in which a sacrificial material 206 may be formed above the transistors 250A, 250B after forming the drain and source extension regions 251 and the halo regions 252. For this purpose, any appropriate material, such as silicon dioxide and the like, may be used, which may be provided by any appropriate deposition technique, such as subatmospheric CVD, plasma assisted CVD and the like. In some illustrative embodiments, the sacrificial material 206 may be provided in the form of an amorphous carbon material, which may also be deposited on the basis of well-established CVD techniques. By providing the sacrificial material 206 so as to also completely cover the active regions 202A, 202B, integrity of the spacer 265 at the foot of the gate electrode structures 260A, 260B may be preserved irrespective of any patterning-related irregularities thereof. Moreover, in some cases, for instance by using amorphous carbon material, a further material loss in the active regions 202A, 202B upon removing the sacrificial material 206 may be avoided, which may, for instance, be associated with the removal of any sacrificial spacer elements.

Figure 2J:
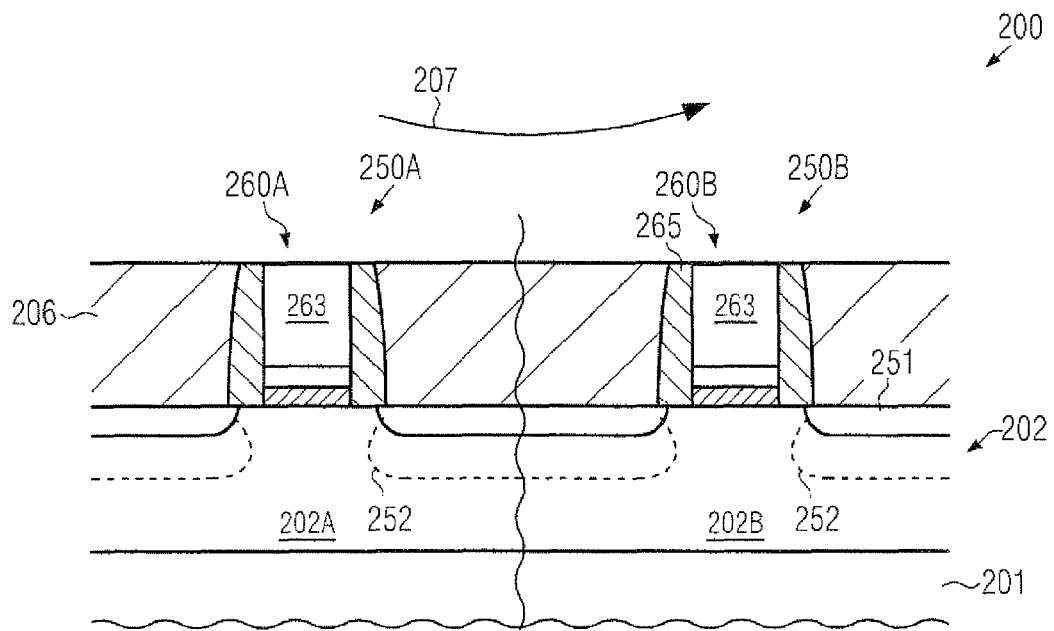

FIG. 2j schematically illustrates the semiconductor device 200 during a process sequence 207 for removing the dielectric cap material 264 (FIG. 2i) and thus exposing the electrode material 263. In some illustrative embodiments, the process sequence 207 comprises a planarization process, such as a chemical mechanical polishing (CMP) process in order to remove material of the layer 206, while using the cap material 264 as a stop material. Thereafter, further processing may be continued by etching the dielectric cap material 264, for instance by hot phosphoric acid, possibly in combination with hydrofluoric acid, depending on the composition of the material 264 as shown in FIG. 2i. In other illustrative embodiments, as illustrated in FIG. 2j, the sequence 207 may comprise a further CMP step so as to expose the electrode materials 263 on the basis of a polishing process. Consequently, the active regions 202A, 202B and the lower portions of the gate electrode structures 260A, 260B may be reliably confined by the remaining portion of the material 206, thereby avoiding any undue interaction of aggressive chemicals, such as slurry materials, etch chemistries and the like. Thereafter, the sacrificial material 206 may be removed, for instance on the basis of hydrofluoric acid, if silicon dioxide is to be etched, while, in other illustrative embodiments, an oxygen plasma may be applied in order to remove amorphous carbon material. In this case, the oxygen plasma may not substantially affect any other device areas and may, therefore, contribute to superior integrity of the spacer 265 and the active regions 202A, 202B.

Figure 2K:
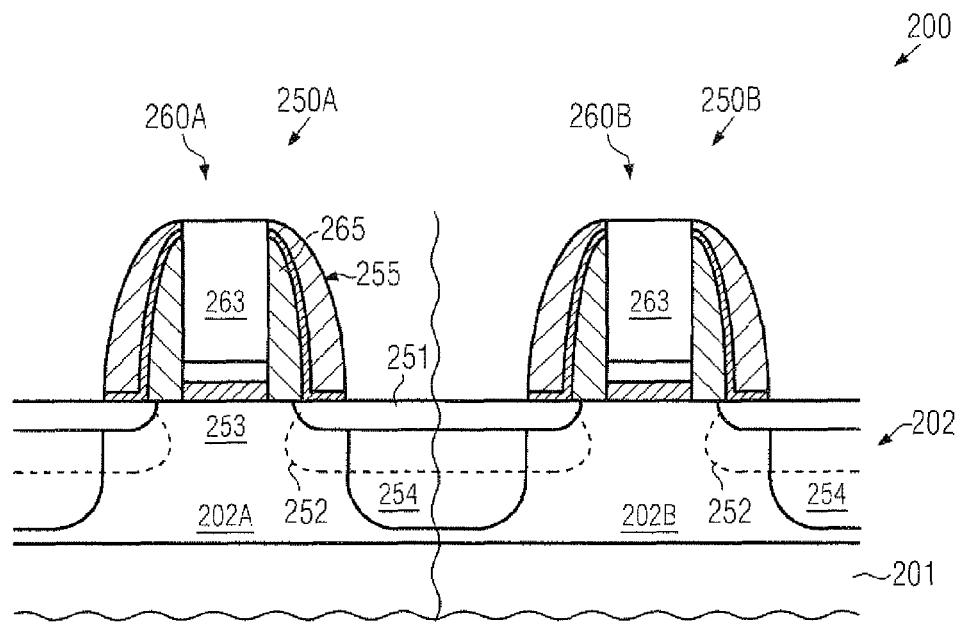
FIGS. 2k-2l schematically illustrate cross-sectional views of the semiconductor device in still further advanced manufacturing stages.

FIG. 2k schematically illustrates the semiconductor device 200 in a further advanced manufacturing stage. As illustrated, the transistors 250A, 250B may comprise a further sidewall spacer structure 255 formed on the protective spacers 265. The spacer structure 255 may have any appropriate configuration, for instance an etch stop liner in combination with a spacer element may be provided by using any appropriate material composition, such as silicon dioxide in combination with silicon nitride. Furthermore, drain and source regions 254 are formed in the active regions 202A, 202B, thereby obtaining the desired overall dopant profile in combination with the extension regions 251 and the halo regions 252.

The spacer structure 255 may be formed on the basis of any appropriate process strategy and, thereafter, an appropriate masking regime may be applied so as to form the drain and source regions 254 for the corresponding transistors 250A, 250B. For example, similar masking regimes may be applied as previously explained when referring to the extension regions 251 and the halo regions 252. Next, one or more anneal processes may be performed to activate dopant species and re-crystallize implantation-induced damage. Furthermore, a certain degree of dopant diffusion, if required, may be initiated in order to obtain the finally-desired overall dopant profile.

Figure 2L:
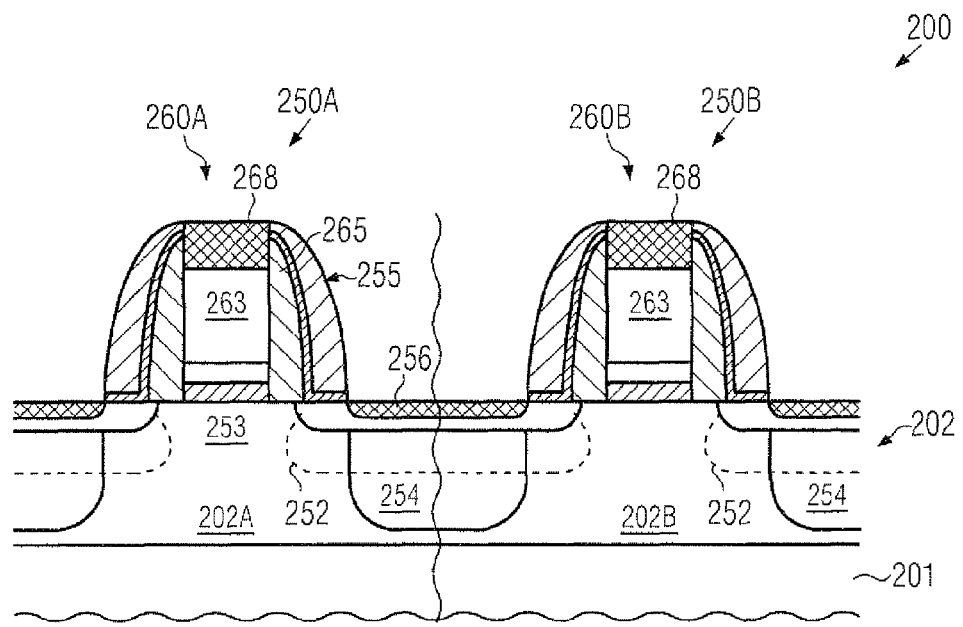

FIG. 2l schematically illustrates the semiconductor device 200 in a further advanced manufacturing stage. As illustrated, metal silicide regions 256, such as nickel silicide and the like, may be formed in the active regions 202A, 202B, wherein a lateral offset from the channel regions 253 may be substantially determined by the spacer structures 265 and 255. Moreover, metal silicide regions 268 may also be formed in the gate electrode structures 260A, 260B, thereby providing superior conductivity.

The metal silicide regions 256, 268 may be formed on the basis of any appropriate process strategy. Thereafter, an interlayer dielectric material may be deposited, for instance, on the basis of silicon nitride, silicon dioxide and the like. It should be appreciated that additional performance enhancing mechanisms may be implemented by providing at least a portion of the interlayer dielectric material with a high internal stress level, thereby generating a desired strain component in the channel regions 253 of one or both of the transistors 250A, 250B. It is well known that a certain degree of strain may modify the charge carrier mobility in the channel regions 253 for a specific crystallographic configuration of the active regions 202A, 202B. Consequently, by appropriately selecting the crystallographic configuration of the semiconductor base material and applying an appropriate strain component, such as compressive or tensile strain, a significant gain in performance may be accomplished. For example, compressive strain may, for specific crystallographic configurations, increase performance of P-channel transistors and hence a corresponding stressed dielectric material may be selectively positioned above the transistor 250A. Similarly, a high tensile stress component of the dielectric material to be formed above the transistor 250B may increase performance of N-channel transistors.

As a result, the present disclosure provides manufacturing techniques in which high-k metal gate electrode structures may be formed on the basis of appropriate work function metals, which may be reliably confined by a sidewall spacer structure, which may subsequently also act as an efficient offset spacer for forming drain and source extension regions and halo regions. Moreover, during the corresponding implantation sequence, the dielectric cap material of the gate electrode structure may be used as an efficient implantation mask, thereby significantly increasing the ion blocking capability of the gate electrode structures, which may allow the application of increased implantation energies for the halo regions. Furthermore, a plurality of aggressive cleaning processes that are typically associated with the masking regimes for incorporating the dopant species for the extension regions and halo regions, in particular for different flavors of transistors, may be performed in a state of high integrity of the protective sidewall spacer, thereby also providing superior integrity of the sensitive gate materials and thus reducing any threshold voltage variations.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a gate electrode structure of a transistor above a semiconductor region of a semiconductor device, said gate electrode structure comprising a gate insulation layer comprising a high-k dielectric material, a metal-containing cap material formed on said gate insulation layer, an electrode material formed above said cap material and a dielectric cap layer;
   forming a protective sidewall spacer structure adjacent sidewalls of said gate electrode structure;
   performing an implantation process to introduce a dopant species for forming halo regions in said semiconductor region by using said dielectric cap layer and said protective sidewall spacer structure as an implantation mask;
   forming a second spacer on said sidewall spacer structure;
   performing an etch process so as to remove said dielectric cap layer by using said second spacer as an etch stop material while preserving at least a portion of said protective sidewall spacer structure;
   removing said second spacer;
   forming a third spacer after removing said second spacer; and forming drain and source regions in said semiconductor region by using said third spacer as an implantation mask.

2. The method of claim 1, further comprising forming drain and source extension regions in said semiconductor region by using said protective sidewall spacer structure as an implantation mask.

3. The method of claim 1, wherein forming said gate electrode structure comprises providing a work function adjusting species in at least one of said metal-containing cap material and said gate insulation layer.

4. The method of claim 1, wherein forming said gate electrode structure comprises forming said gate electrode structure with a gate length of 40 nm or less.

5. The method of claim 1, further comprising forming a threshold adjusting semiconductor material on said semiconductor region prior to forming said gate electrode structure.

6. The method of claim 1, further comprising forming a metal silicide in said drain and source regions and in said electrode material.

7. A method of forming a transistor of a semiconductor device, the method comprising:
    forming a gate dielectric material on a semiconductor region;
    forming a conductive cap material on said gate dielectric material, at least one of said conductive cap material and said gate dielectric material comprising a work function adjusting metal species;
    forming an electrode material and a dielectric cap layer above said conductive cap material;
    forming a gate electrode structure from said gate dielectric material, said conductive cap material, said electrode material and said dielectric cap layer;
    forming a protective sidewall spacer structure adjacent sidewalls of said gate electrode structure;
    forming drain and source extension regions and halo regions in the presence of said dielectric cap layer by using said protective sidewall spacer as an implantation mask for adjusting a lateral offset;
    forming a sacrificial spacer adjacent said protective sidewall spacer structure;
    performing an etching process to remove said dielectric cap layer using said sacrificial spacer as an etch mask;
    removing said sacrificial spacer;
    after removing said sacrificial spacer, forming a second spacer structure adjacent said protective sidewall spacer structure; and
    forming drain and source regions in said semiconductor region by using said second spacer structure as an implantation mask.

8. The method of claim 7, wherein forming said sacrificial spacer comprises depositing a spacer layer and etching said spacer layer and a portion of said dielectric cap layer in a common etch process.

9. The method of claim 7, further comprising forming a metal silicide in said drain and source regions and in said gate electrode structure.

10. A method of forming a semiconductor device, the method comprising:
    forming a first gate electrode structure above a first active region, said first gate electrode structure comprising a first work function adjusting metal species and an electrode material;
    forming a second gate electrode structure above a second active region, said second gate electrode structure comprising a second work function adjusting metal species that differs from said first work function adjusting metal species and an electrode material;
    forming a cap layer on said electrode material of said first gate electrode structure and on said electrode material of said second gate electrode structure;
    forming a protective spacer structure adjacent sidewalls of said first and second gate electrode structures;
    performing a first implantation sequence to form first drain and source extension regions and halo regions in said first active region by using said protective spacer structure and said cap layer on said gate electrode material of said first gate electrode structure as an implantation mask while masking said second active region;
    performing a second implantation sequence to form second drain and source extension regions and halo regions in said second active region by using said protective spacer structure and said cap layer on said gate electrode material of said second gate electrode structure as an implantation mask while masking said first active region;
    forming a sacrificial spacer adjacent said protective spacer structure;
    performing an etching process to remove said cap layer using said sacrificial spacer as an etch mask;
    after removing said cap layer, removing said sacrificial spacer;
    after removing said sacrificial spacer, forming a second spacer structure adjacent said protective spacer structure; and
    forming drain and source regions in said first and second active regions by using said second spacer structure as an implantation mask.

* * * * *